May 9, 1967 H. F. RUEFFER 3,319,139

PLANAR TRANSISTOR DEVICE HAVING A REENTRANT SHAPED EMITTER REGION WITH BASE CONNECTION IN THE REENTRANT PORTION

Filed Aug. 18, 1964

INVENTOR.
HAROLD F. RUEFFER,
BY
W. H. MacAllister Jr
ATTORNEY.

United States Patent Office 3,319,139
Patented May 9, 1967

3,319,139

PLANAR TRANSISTOR DEVICE HAVING A REENTRANT SHAPED EMITTER REGION WITH BASE CONNECTION IN THE REENTRANT PORTION

Harold F. Rueffer, Costa Mesa, Calif., assignor to Hughes Aircraft Company, Culver City, Calif., a corporation of Delaware Filed Aug. 18, 1964, Ser. No. 390,378
7 Claims. (Cl. 317—235)

This invention relates to semiconductor devices and particularly to solid-state junction transistors. More particularly, the invention relates to junction transistors of the so-called "planar" type wherein the rectifying junctions extend to and terminate at a common surface of a semiconductor body.

In certain kinds of circuitry particularly in $T^2L$ logic integrated circuitry using transistors, it is desirable that the collector-emitter voltage ($V_{CE}$) be minimized. In the usual transistor device in which the collector region has an exposed surface opposite the emitter-base junction it is possible to make a connection to the collector region at such exposed surface of the collector. Hence, it is possible to minimize $V_{CE}$ by making the collector connection at that portion of the collector region which is nearest the base-emitter junction, thus minimizing the length of the resistive path in the collector region. This follows since:

$$V_{CE}=V_{CB}-V_{EB}+i(R_t)$$

where $V_{CB}$ is the collector-base voltage, $V_{EB}$ is the emitter-base voltage, $i$ is the current, and $R_t$ is the total resistance. Hence, by reducing any portion of $R_t$ and particularly that contributed by the path from the collector contact to the collector-base junction opposite the base-emitter junction, $V_{CE}$ may be reduced.

The use of a "planar" transistor device in such circuit applications, however, poses a problem in obtaining a sufficiently low $V_{CE}$ because such transistor devices are usually disposed on an insulating substrate in such a manner that connections to the collector, base, and emitter regions must all be made from a common surface. One cannot make a direct connection to the "back" of the collector region since it is no longer exposed on this surface. Hence, the length (L) of the resistive path in the collector region to the point thereof which is nearest to the base region opposite the emitter-base junction is relatively quite long. Thus the increased length of the resistive path of the collector region in such planar devices results in an increased $V_{CE}$.

It is therefore an object and the purpose of the invention to provide an improved planar transistor device.

Another of the objects and purposes of the invention is to provide an improved planar transistor having a lower collector-emitter voltage than heretofore.

These and other objects and advantages of the invention are realized by disposing at least a portion of the base region within the emitter region and locating the metallized connection or connections to the base region at or on this emitter-surrounded portion of the base region thus reducing the lateral distance between the edge of the emitter region and the connection or contact to the collector region. In other words, the lateral distance from the edge of the emitter region to the connection to the collector region may now be minimized since the intervening base region does not have to be made large, as heretofore, for the purpose of providing sufficient area for a metallic connection to the base region between the emitter and collector regions. Such an arrangement provides a resistive path of minimum length in the collector region of a planar transistor thereby obtaining a decrease in $V_{CE}$. Also, by the invention, only a small percentage of the periphery of the emitter region is required to be adjacent the metallized connection to the base region which arrangement results in an advantageous increase in the high frequency base resistivity ($rb'$). These results and characteristics are achieved in one embodiment of the invention by providing a planar transistor having metallized connections to the collector, base, and emitter regions, with the emitter having a U-shaped portion in which a tapered metallized contact to the base region is disposed. The base contact thus is, in effect, positioned inside the emitter region. As used herein and especially in the appended claims the term "re-entrant" means directed inwardly and is intended to describe emitter surface or planar configurations having U-shaped or other correspondingly shaped portions in which a surface of the base region is exposed.

The invention will be described in greater detail hereinafter with reference to the drawings in which.

Figure 1:
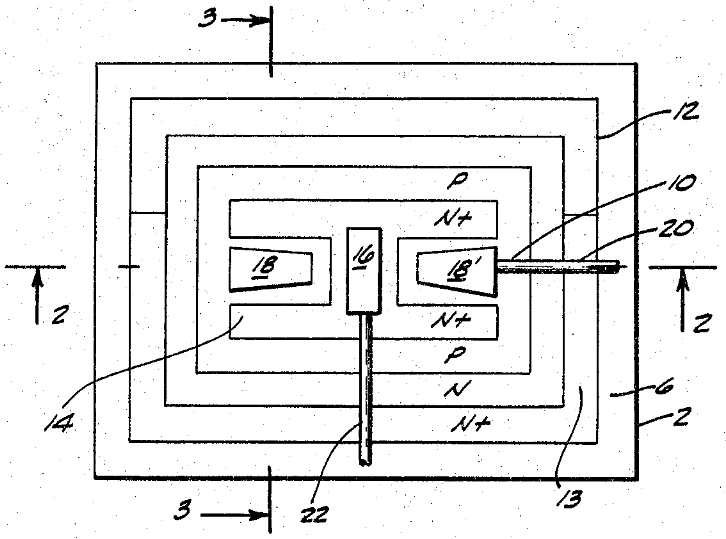
FIGURE 1 is a plan view of a planar transistor device according to the present invention.
Figure 2:
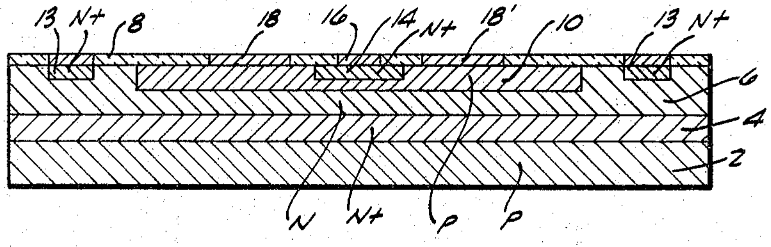
FIGURE 2 is an elevational view in section taken along the line 2—2 in FIGURE 1.
Figure 3:
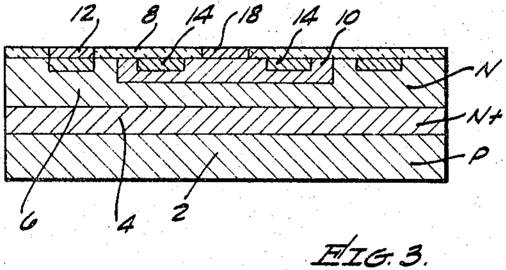
FIGURE 3 is an elevational view in section taken along the line 3—3 in FIGURE 1.

Before proceeding with a detailed description of the transistor of the invention it is convenient to define some terms of art which are pertinent to the present invention and its fabrication. An "integrated circuit" is one which is usually formed of evaporated and deposited materials on an insulating substrate to provide the passive and active components necessary to achieve some desired circuit function. "Passive" components are understood to include resistors, capacitors, and inductances, while "active" components means diodes, rectifiers, amplifiers and includes transistors and the like. As used herein the terms "N-type" and "P-type" refer to current conduction by negative (electrons) or positive (holes) charge carriers, respectively. The term "impurity" is employed to designate a material which when intentionally incorporated into the crystal lattice structure of a semiconductor crystalline material establishes a particular type of current conductivity therein. Thus, an impurity atom containing at least one more valence electron than an atom of the semiconductor material is termed an N-type (negative) impurity or a donor impurity since it contributes electrons for current conduction in the semiconductor crystal lattice structure. An impurity atom containing at least one less valence electron than an atom of the semiconductor material is termed a P-type (positive) impurity or an acceptor impurity since it contributes "holes" (or accepts electrons) for current conduction. A semiconductor material into which such impurities have been introduced is said to be "doped" and is P-type or N-type depending upon the conductivity-type established by the nature of the conductivity-type-determining impurity incorporated therein. One of the methods for introducing an impurity into a semiconductor body is by diffusion which refers to the penetration of the semiconductor crystal lattice structure by impurity atoms without the necessity for melting the semiconductor body. It is understood that such atomic migration will occur from an impurity material which may be brought into contact with a pre-selected surface of the semiconductor body in either the solid, liquid or gaseous phase thereof. It is preferred in the industry to use a gaseous diffusion which means that the semiconductor body is disposed in an atmosphere containing atoms of the impurity to be introduced therein. Because of the diffusion process being temperature dependent, it may be accelerated and controlled by maintaining the semiconductor body at an elevated temperature.

The junction-type semiconductor device is well known and understood in the art today and its operation need not be described in great detail in order to explain the instant invention. The particular semiconductor device to which the present invention is especially but not exclusively applicable is the so-called "planar" NPN transistor. Such a transistor comprises a bulk body of semiconductor material such as silicon, for example, of N-type conductivity. In one surface portion of the N-type semiconductor body (which portion may be called the "collector") a region of P-type conductivity is established by diffusing an N-type impurity into a restricted portion of this surface by means of a mask. This P-type region may be called the "base." By further masking, a restricted portion of the P-type base region thus established is further converted to N-type conductivity by the diffusion of an N-type impurity therein to form what may be called an "emitter." It will be understood that P-N junctions are formed at the boundaries between these regions of opposite conductivity, there being a collector-base junction and an emitter-base junction. In the case of silicon semiconductor material the masking necessary to permit these operations and to establish the requisite regions of different or opposite conductivity is preferably formed of an oxide of the silicon semiconductor material. Such devices are well known and their fabrication is described, for example, in U.S. Patent 3,025,589 to J. A. Hoerni. It will be understood that as a result of the diffusion process through an oxide mask, the base-collector junction as well as the emitter-base junction extend to the surface of the semiconductor body and are disposed under the covering oxide mask employed so that at all times these junctions are protected from the ambient atmosphere by the relatively chemically inert and electrically insulating oxide mask which is left in place for the purpose of protecting these junctions.

Referring now to the drawings, an NPN planar transistor according to the present invention is shown. A substrate member 2 of high resistivity P-type silicon, for example, is provided for supporting the NPN transistor to be disposed thereon. The resistivity of the substrate member 2 may be about 10 to 20 ohm/cm., for example. The substrate member 2 preferably is of single crystalline lattice structure so as to enhance the formation thereon of a single crystalline layer 4 of low resistivity N-type silicon. In this process N-type silicon may be formed and caused to deposit on the upper surface of the substrate member 2 by the simultaneous reduction in hydrogen of arsenic or phosphorous trichloride and silicon tetrachloride at a temperature of from 1200–1300° C. This process is well known in the art and is fully described by H. C. Theuerer in the Journal of the Electrochemical Society (1961—vol. 108 at page 649) and by A. Mark in the same journal (1961—vol. 108 at page 880).

After the N-type epitaxial layer 4, which may be about 5 microns thick, for example, is formed, a layer 6 of higher resistivity N-type silicon may be formed on the exposed surface of the N-type layer 4 again by the epitaxial deposition process just described. The average resistivity of the N-type layer 6 may be about 0.1 to 0.5 ohm/cm., for example, and the layer may extend down to about 5 microns into the N-type layer 4.

Thereafter, the exposed surface of the N-type layer 6 may be provided with an overall coating 8 of silicon oxide, for example, by oxidizing this surface. By means of photo-resist and etching techniques a centrally-disposed portion of the oxide mask 8 is removed. Thus, the oxide layer 8 may be coated with a photo-resist material, a portion of which is exposed to light as through a mask which establishes a light pattern corresponding to the shape and dimension of the portion of the oxide coating to be removed. The photo-resist is then developed whereby the etch-resistant exposed portions are unaffected while the unexposed central portion is removed by dissolution, as is well known in this process, to expose a predetermined area of the oxide coating 8. The thus-exposed oxide is then removed as by etching the same with hydrofluoric acid to expose a predetermined area of the N-type layer 6. Thereafter the remaining etch resistant photo-resist coating may be removed altogether. As shown in the drawings the openings provided in the oxide layer 8 may be of rectangular shape and is for the purpose of permitting the formation of the base region 10 of a planar transistor according to the invention.

To achieve the formation of the base region 10, the assembly is heated and exposed to an atmosphere containing the vapors of a P-type conductivity-type-determining impurity, such as boron, for example, which by the process of diffusion establishes a P-type layer 10 forming a submerged region in the N-type collector region 6. The base region 10 may have a resistivity of about 50 ohm/square at a depth of approximately 4 microns beneath the surface of the crystal body.

After the base diffusion step has been completed the exposed surface of the base region is recovered or closed by an additional oxide layer 8 which is achieved by oxidizing this surface as was done previously. It is possible to accomplish the closing of the base window in the oxide coating 8 during the boron diffusion step by introducing an oxidizing agent into the diffusant atmosphere with the boron. Such diffusion and oxide masking techniques are well known in the art and reference is made to two patents, 2,802,706 to Derick and Frosch and 3,025,589 to Hoerni for a fuller, more detailed description thereof.

Thereafter, by means of the photo-resist and etching techniques described previously, portions of the oxide are removed from the surface of the P-type base region 10 so as to form an H-shaped opening therein with the bar connecting the legs of the H being equal to about twice the width of the legs. At the same time an opening is made in the form of a loop disposed in the peripheral portions of the N-type collector region 6. For convenience only half of the loop is shown in FIGURE 1. This loop is ultimately to permit the electrical connection to be made to the collector region 6 by means of a metallic deposit 12 as shown in FIGURE 1. After these requisite openings have been provided in the oxide mask or covering 8, the entire exposed surface is then subjected to a further diffusion step to effect the conversion of the exposed surface of the P-type base region 10 to low resistivity N-type conductivity and to establish the loop region 13 in the collector region of similar low resistivity N-type conductivity. By this diffusion step an H-shaped diffused emitter region 14 is established in the P-type base region 10 as best shown in FIGURE 1. In addition, the aforementioned loop collector connection region 13 is simultaneously provided. It is not absolutely necessary to provide such a special collector connection loop 13 of low resistivity N-type material for the purposes of the present invention. However, since the electrical connections to the base, emitter, and collector regions are to be formed by the deposition of a metal onto exposed surface portions thereof, it is of advantage to employ the same metal for all connections. Thus, by providing a region 13 of N-type conductivity in the collector region 6 which is of the same resistivity as the emitter region 14, it is possible to utilize the same metallic material for all connections.

After the N-type diffusion step, which establishes the emitter region 14 and the collector connection region 13, the entire surface of the assembly is again coated with an oxide as by oxidizing the exposed portions. As before, this oxidizing step may be performed concurrently with the N-type diffusion step just completed. Thereafter, again by the aforementioned photo-resist and etching techniques, openings are made through the protective oxide layer 8 to expose a portion or portions of the contact region or loop 13 of the collector region 6 as well as a portion of the cross-bar of the H-shaped emitter region. In addition, the same techniques are utilized to form tapered openings to the base region 10 solely on those surfaces of the base layer 10 which are disposed between the legs of the H-shaped emitter region 14. These openings are tapered so that the narrowest portions are disposed adjacent the cross-bar portions of the H-shaped emitter region as shown in FIGURE 1.

Electrically conductive material such as aluminum, for example, may then be evaporated and deposited upon the exposed portions of the base, emitter and collector regions to form the contacts for these regions. It will also be understood that electrical connections may be provided to these contacts by depositing the same or other suitable metal through a mask or the like over the oxide layer 8. Such metallic strip connections 20 and 22 are shown to the base and emitter contacts 18' and 16, respectively. The emitter contact 16 is disposed on the cross-bar of the emitter region as mentioned previously. The base contacts 18 and 18' are disposed within the emitter region and do not lie between the emitter region 14 and the collector region 6.

There thus has been described a planar transistor device in which the lateral distance from the edge of the emitter region to the connection to the collector region is minimized, thus providing a resistive path of minimum length in the collector region resulting in a decrease in $V_{CE}$. An improvement has also been described in which the base contact is tapered so as to result in an improvement in emitter injection at the ends or narrow portions of the tapered contact fingers.

What is claimed is:

1. A planar transistor device comprising:
(a) a semiconductor body having a first surface;
(b) a collector region of a first type of conductivity disposed in said body and having a surface portion forming a part of said first surface of said body;
(c) a base region of a different type of conductivity to said first type disposed in said collector region having a surface portion forming a part of said first surface of said body;
(d) an emitter region having said first type of conductivity disposed in said base region and having at least in part a planar reentrant surface portion forming a part of said first surface of said body whereby a portion of said surface portion of said base region is exposed through said reentrant portion of said emitter region;
(e) a base contact disposed on said surface portion of said base region and within said reentrant portion;
(f) and separate electrical contacts disposed on said emitter and collector regions on said first surface.

2. The invention according to claim 1 wherein an electrically insulating coating is disposed over portions of said first surface of said semiconductor body with openings therein for said contacts to said emitter, collector and base regions.

3. The invention according to claim 2 wherein electrical connections to said emitter and base contacts are provided by metallic layers disposed over said electrically insulating coating and in electrically conducting relationship with said contacts.

4. The invention according to claim 1 wherein said base contact is tapered.

5. A planar transistor device comprising:
(a) a semiconductor body having a first surface;
(b) a collector region of a first type of conductivity disposed in said body and having a surface portion forming a part of said first surface of said body;
(c) a base region of a different type of conductivity to said first type disposed in said collector region and having a surface portion forming a part of said first surface of said body;
(d) an emitter region having said first type of conductivity disposed in said base region and having at least in part a U-shaped surface portion forming a part of said first surface of said body whereby a portion of said surface portion of said base region is exposed through said U-shaped portion of said emitter region;
(e) a base contact disposed on said surface portion of said base region and within said U-shaped portion;
(f) and electrical contacts disposed on said emitter and collector regions on said first surface.

6. A planar transistor device comprising:
(a) a semiconductor body having a first surface;
(b) a collector region of a first type of conductivity disposed in said body and having a surface portion forming a part of said first surface of said body;
(c) a base region of a different type of conductivity to said first type disposed in said collector region and having a surface portion forming a part of said first surface of said body;
(d) an emitter region having said first type of conductivity disposed in said base region and having at least in part an H-shaped surface portion forming a part of said first surface of said body whereby a portion of said surface portion of said base region is exposed through said H-shaped portion of said emitter region;
(e) a base contact disposed on said surface portion of said base region and within said H-shaped portion;
(f) and electrical contacts disposed on said emitter and collector regions on said first surface.

7. A planar transistor device comprising:
(a) a semiconductor body having a first surface;
(b) a collector region of a first type of conductivity disposed in said body and having a surface portion forming a part of said first surface of said body;
(c) a base region of a different type of conductivity to said first type disposed in said collector region having a surface portion forming a part of said first surface of said body;
(d) an emitter region having said first type of conductivity disposed in said base region and having at least in part a U-shaped surface portion forming a part of said first surface of said body whereby a portion of said surface portion of said base region is exposed through said U-shaped portion of said emitter region;
(e) an electrically insulating coating disposed over portions of said first surface of said body and having openings therein to said emitter region and to said exposed portion of said base region;
(f) a base contact disposed on said surface portion of said base region and within said U-shaped portion;
(g) and electrical contacts disposed on said emitter and collector region on said first surface.

References Cited by the Examiner

UNITED STATES PATENTS

| | | | |
|---|---|---|---|
| 2,560,594 | 7/1951 | Pearson | 317—235 |
| 3,160,800 | 12/1964 | Smart | 317—235 |
| 3,184,657 | 5/1965 | Moore | 317—235 |
| 3,184,823 | 5/1965 | Little et al. | 317—235 |
| 3,191,070 | 6/1965 | Jones et al. | 317—235 |
| 3,204,321 | 9/1965 | Kile | 317—235 |

FOREIGN PATENTS

| | | |
|---|---|---|
| 239,889 | 5/1960 | Australia. |

JOHN W. HUCKERT, *Primary Examiner.*

J. D. CRAIG, *Assistant Examiner.*